(12) United States Patent
Clevenger et al.

(10) Patent No.: US 11,043,494 B2
(45) Date of Patent: Jun. 22, 2021

(54) STRUCTURE AND METHOD FOR EQUAL SUBSTRATE TO CHANNEL HEIGHT BETWEEN N AND P FIN-FETS

(71) Applicant: International Business Machines Corporation, Armonk, NY (US)

(72) Inventors: Lawrence A. Clevenger, Rhinebeck, NY (US); Leigh Anne H. Clevenger, Rhinebeck, NY (US); Mona A. Ebrish, Albany, NY (US); Gauri Karve, Cohoes, NY (US); Fee Li Lie, Albany, NY (US); Deepika Priyadarshini, Guilderland, NY (US); Indira Priyavarshini Seshadri, Albany, NY (US); Nicole A. Saulnier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 16/460,018

(22) Filed: Jul. 2, 2019

(65) Prior Publication Data
US 2019/0326289 A1    Oct. 24, 2019

Related U.S. Application Data

(62) Division of application No. 15/402,704, filed on Jan. 10, 2017, now Pat. No. 10,381,348.

(51) Int. Cl.
*H01L 27/092* (2006.01)
*H01L 21/8238* (2006.01)
(Continued)

(52) U.S. Cl.
CPC ...... *H01L 27/0924* (2013.01); *H01L 21/3086* (2013.01); *H01L 21/76224* (2013.01);
(Continued)

(58) Field of Classification Search
CPC .......... H01L 27/0924; H01L 21/76224; H01L 29/1054; H01L 21/823807;
(Continued)

(56) References Cited

U.S. PATENT DOCUMENTS 7,288,445 B2    10/2007    Bryant et al.
7,719,059 B2    5/2010    Hofmann et al.
(Continued)

FOREIGN PATENT DOCUMENTS

JP    62224082    10/1987

OTHER PUBLICATIONS

List of IBM Patents or Patent Applications Treated as Related.

*Primary Examiner* — Mohammed R Alam
(74) *Attorney, Agent, or Firm* — Fleit Intellectual Property Law; Donna Flores (57) ABSTRACT

A method for fabricating fin field effect transistors comprises creating a pattern of self-aligned small cavities for P-type material growth using at least two hard mask layers, generating a pre-defined isolation area around each small cavity using a vertical spacer, selectively removing N-type material from the self-aligned small cavities, and growing P-type material in the small cavities. The P-type material may be silicon germanium (SiGe) and the N-type material may be tensile Silicon (t-Si). The pattern of self-aligned small cavities for P-type material growth is created by depositing two hard mask materials over a starting substrate wafer, selectively depositing photo resist over a plurality N-type areas, reactive ion etching to remove the second hard mask layer material over areas not covered by photo resist to create gaps in second hard mask layer, and removing the photo resist to expose the second hard mask material in the N-type areas.

19 Claims, 6 Drawing Sheets

(51) Int. Cl.
*H01L 29/66* (2006.01)
*H01L 29/06* (2006.01)
*H01L 29/161* (2006.01)
*H01L 29/78* (2006.01)
*H01L 21/308* (2006.01)
*H01L 21/762* (2006.01)
*H01L 29/10* (2006.01)

(52) U.S. Cl.
CPC ........ *H01L 21/823807* (2013.01); *H01L 21/823821* (2013.01); *H01L 21/823892* (2013.01); *H01L 27/0928* (2013.01); *H01L 29/0649* (2013.01); *H01L 29/1054* (2013.01); *H01L 29/161* (2013.01); *H01L 29/6653* (2013.01); *H01L 29/7849* (2013.01); *H01L 21/823878* (2013.01); *H01L 27/092* (2013.01)

(58) Field of Classification Search
CPC ........ H01L 21/823892; H01L 27/0928; H01L 21/3086; H01L 21/823821; H01L 29/6653; H01L 29/0649; H01L 29/161; H01L 29/7849; H01L 27/092; H01L 21/823878

See application file for complete search history.

(56) References Cited

U.S. PATENT DOCUMENTS

| | | |
|---|---|---|
| 8,563,394 B2 | 10/2013 | Li et al. |
| 8,841,188 B2 | 9/2014 | Reznicek et al. |
| 9,123,569 B1 | 9/2015 | Cheng et al. |
| 2008/0265280 A1* | 10/2008 | Currie ............... H01L 27/1207 257/190 |
| 2012/0319211 A1 | 12/2012 | van Dal et al. |
| 2015/0235905 A1 | 8/2015 | Liaw |
| 2015/0255460 A1 | 9/2015 | Cheng et al. |

* cited by examiner

STRUCTURE AND METHOD FOR EQUAL SUBSTRATE TO CHANNEL HEIGHT BETWEEN N AND P FIN-FETS

CROSS REFERENCE TO RELATED APPLICATIONS

This application is a Divisional application of U.S. patent application Ser. No. 15/402,704, filed on Jan. 10, 2017, entitled "Structure and Method for Equal Substrate to Channel Height Between N and P Fin-FETs," the entirety of which is hereby incorporated into the present application by reference.

BACKGROUND

Field of Invention

The present disclosure generally relates to semiconductor manufacturing, and more particularly relates to a structure and method of fabrication for equal substrate to channel height between N and P channels in fin field effect transistors (fin-FETs).

Description of the Related Art

Current limitations of reactive ion etching (RIE) when the N and P channels are different materials include unlevel N to P channel surfaces and limited N to P boundary distances caused by epi prebake corner rounding. These limitations become more noticeable as the size of the transistor devices shrink.

Figure 1:
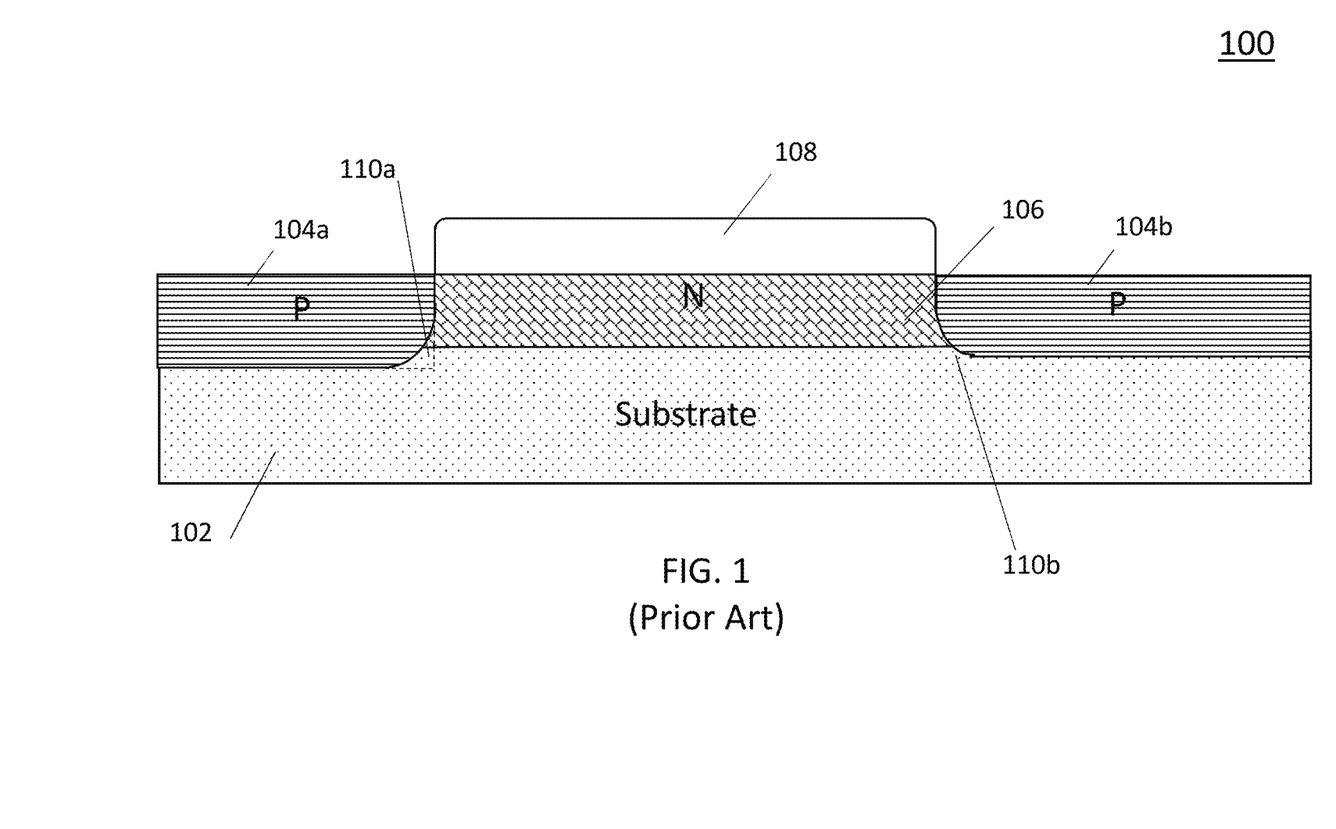
FIG. 1 is a cross-sectional illustration of a prior art example of a fin-FET.

FIG. 1 illustrates a cross-sectional drawing of a prior art fin-FET 100 which highlights these problems. Fin-FET 100 is formed on a substrate layer 102, generally made, for example, from a low percentage Silicon (Si). Another Si layer 106 having a higher percentage of Si is grown on top of the substrate. Areas that are intended to be N-type areas are masked off using a nitride photo resist masking 108 and the wafer is reactive ion etched to remove the Si from areas that are not covered by the photo resist masking 108. Areas which have had the Si removed are intended to be P-type areas. A different material, such as SiGe, is grown over the substrate to form the P-type areas 104a, 104b.

Unlevel N to P channel surfaces are created during reactive ion etching (RIE). The RIE process effectively "scoops out" sections of the silicon. However, the RIE process is not exact and tends to also remove small portions of the Si substrate 102. Depths of the removed sections vary according to exposed surface areas. For example, the channel depth of small exposed surface areas 104a tends to be deeper than the channel depth of larger exposed surface areas 104b.

Additionally, the RIE process produces rounded corners 110a, 110b along the borders between the N-type area 106 and the P-type areas 104a, 104b which causes irregularities along the border and limits useable space.

BRIEF SUMMARY

In one embodiment, a method for fabricating fin field effect transistors is disclosed. The method comprises creating a pattern of self-aligned small cavities for P-type material growth using at least two hard mask layers, generating a pre-defined isolation area around each small cavity using a vertical spacer, selectively removing N-type material from the self-aligned small cavities; and growing P-type material in the small cavities.

In another embodiment, a fin field effect transistor (fin-FET) device comprises a substrate layer, a plurality of N-type areas, and a plurality of P-type areas. Each N-type area is made of N-type material and located above the substrate layer. Each P-type area is made of P-type material and located above the substrate layer and adjacent to at least one N-type area. Each P-type area and each N-type area have an equal channel height, an equal substrate to channel interface and a minimum distance between N and P active regions in a direction parallel to the substrate layer.

BRIEF DESCRIPTION OF THE SEVERAL VIEWS OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

In this disclosure, a method is provided for a new method of manufacturing fin-FETs which provides equal N and P channel heights as well as eliminates corner rounding at the boundaries.

In one embodiment, self-aligned small cavity patterns are created using dual hard masks and spacers to generate pre-defined isolation areas between N and P channels and selectively remove tensile Silicon (t-Si) areas from the substrate.

Figure 2:
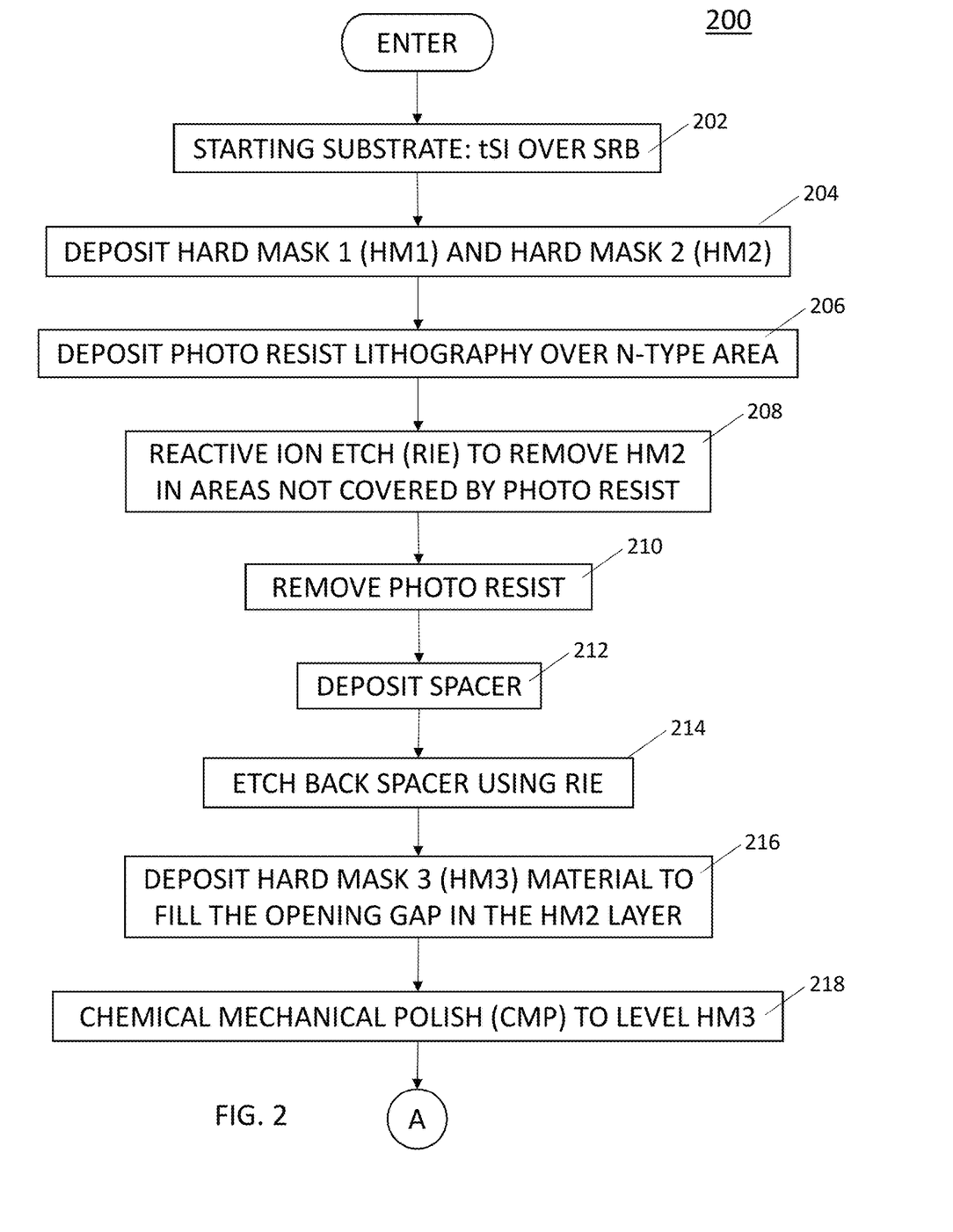
FIG. 2 is an operational flow diagram illustrating a process for manufacturing a fin-FET wafer according to one embodiment of the present invention.
Figure 3:
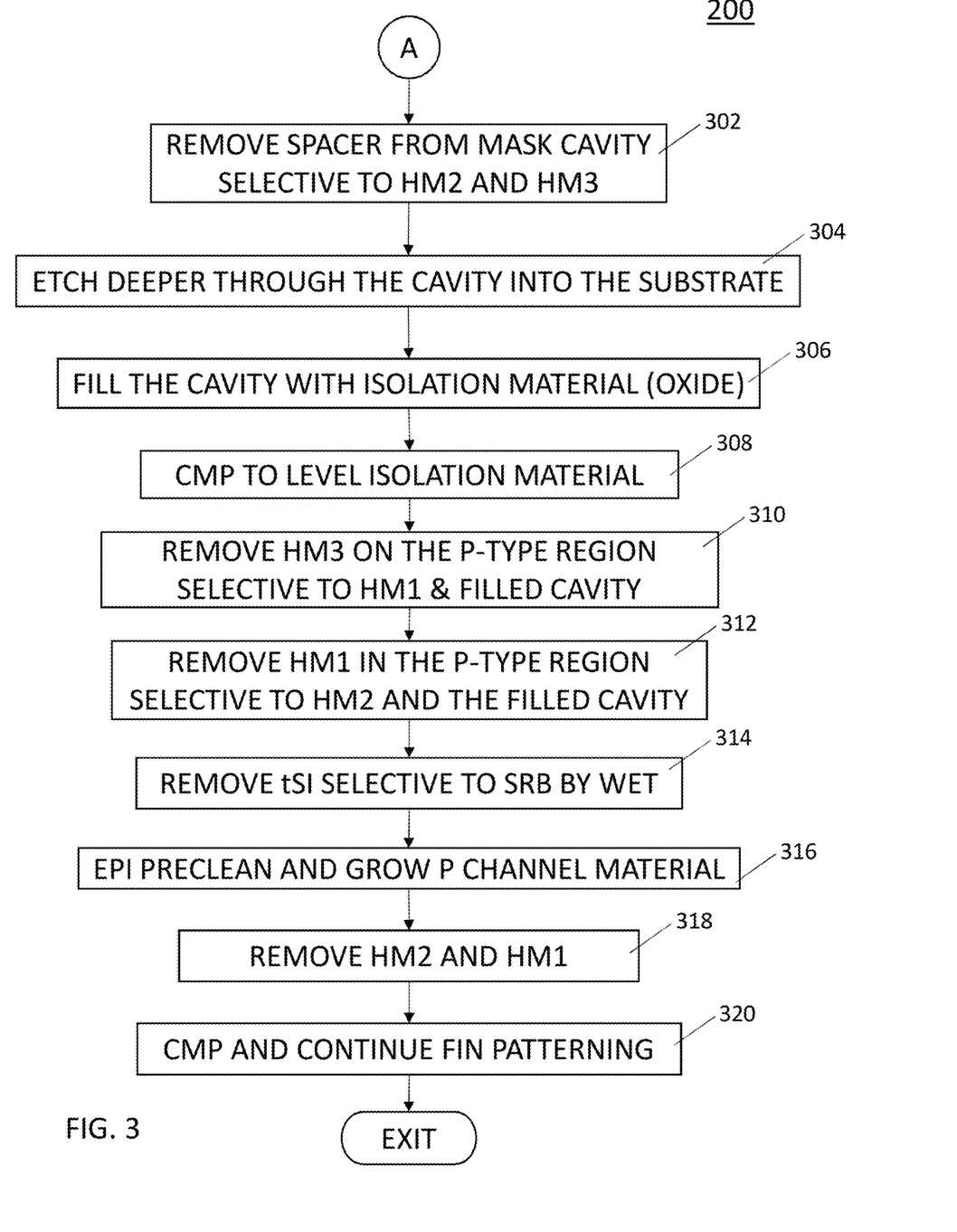
FIG. 3 is a continuation of the operational flow diagram of FIG. 2 illustrating a process for manufacturing a fin-FET wafer according to one embodiment of the present invention.

Turning now to FIGS. 2 and 3, an operational flowchart 200 is provided which illustrates a process for manufacturing a fin-FET wafer having equal channel heights and no boundary corner rounding, according to one embodiment of the present disclosure. FIGS. 4 through 21 are cross-sectional illustrations showing the status of the wafer at each step of the procedure. It should be noted that the drawings in FIG. 4 through 21 are not to scale and are shown for illustrative purposes only. Although the process is described with respect to creating a single N and P channel pair, it should be obvious to one skilled in the art that the process creates a multitude of N and P channels over the entirety of a wafer.

Figure 4:
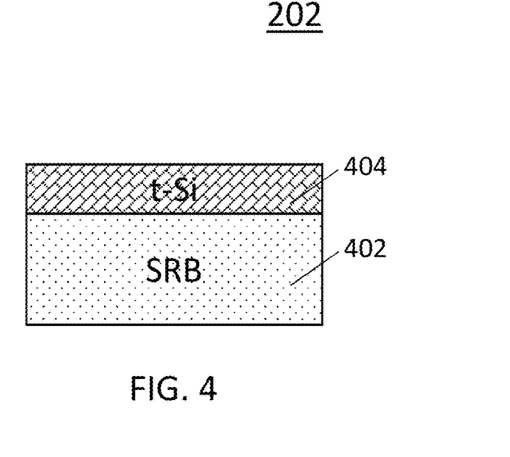
FIG. 4 is a cross-sectional illustration showing a fin-FET at step 202 of the operational flow diagram of FIG. 2.
Figure 5:
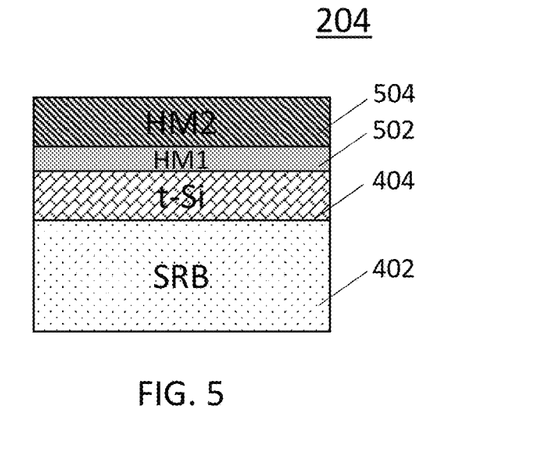
FIG. 5 is a cross-sectional illustration showing a fin-FET at step 204 of the operational flow diagram of FIG. 2.

The process begins, at step 202, by providing a starting substrate which consists of a low percentage silicon strain relief buffer (SRB) layer 402 covered by a t-Si layer 404, as shown in FIG. 4. At step 204, hard mask layers HM1 502 and HM2 504 are deposited over the starting substrate, as shown in FIG. 5. Hard mask layer HM1 502 and HM2 504 have different chemical compositions. For example, in one embodiment, HM1 502 may be formed using silicon nitride (SiN) or other nitrides and HM2 504 may be formed using oxide; however, other hard mask materials (such as Amorphise Silicon (a-Si) or multi-layered hard mask materials may also be used.

Figure 6:
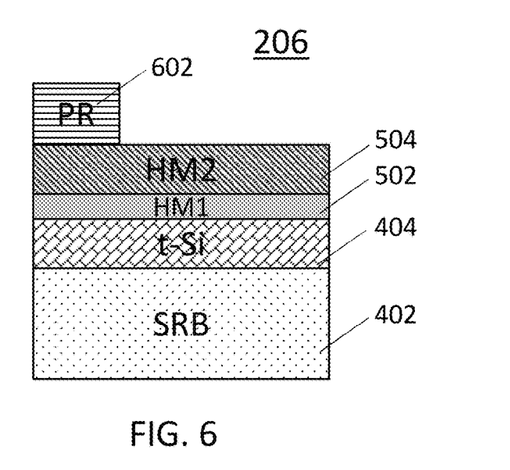
FIG. 6 is a cross-sectional illustration showing a fin-FET at step 206 of the operational flow diagram of FIG. 2.
Figure 7:
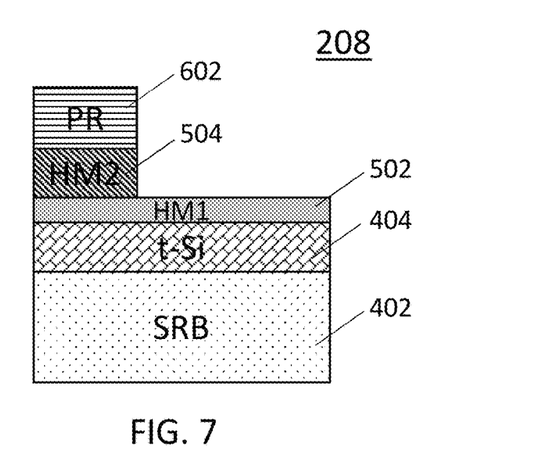
FIG. 7 is a cross-sectional illustration showing a fin-FET at step 208 of the operational flow diagram of FIG. 2.
Figure 8:
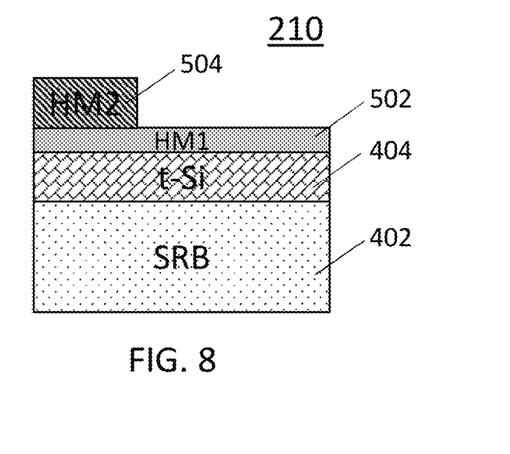
FIG. 8 is a cross-sectional illustration showing a fin-FET at step 210 of the operational flow diagram of FIG. 2.

At step 206, a photo resist pattern (PR) 602 is deposited over areas designated as N-type areas using photolithography, as shown in FIG. 6. At step 208, reactive ion etching (RIE) is performed to remove the HM2 504 layer in areas not covered by photo resist 602, as shown in FIG. 7. It should be noted that the areas not covered by photo resist are designated to be P-type areas and may have different surface areas depending upon the intended use and required specifications of the semiconductor device. During RIE, an ion gun is shot at the wafer and removes the nitride HM2 504 layer. However, the ion blast does not penetrate the second hard mask layer HM1 502 which is made of oxide, so the RIE process cleanly removes only the HM2 504 layer, leaving the HM1 502 layer and the t-Si layer 404 intact and providing straight edges. In contrast, in prior RIE procedures which remove the t-Si layer 404 directly, there is no barrier between the t-Si layer 404 and the substrate, so there is nothing to stop the ions, resulting in the "scooping" action which causes uneven channel heights and rounded corners at the edges. At step 210, the photo resist layer 602 is removed using techniques known in the art, leaving the hard mask layer HM2 504 exposed, as shown in FIG. 8.

Figure 9:
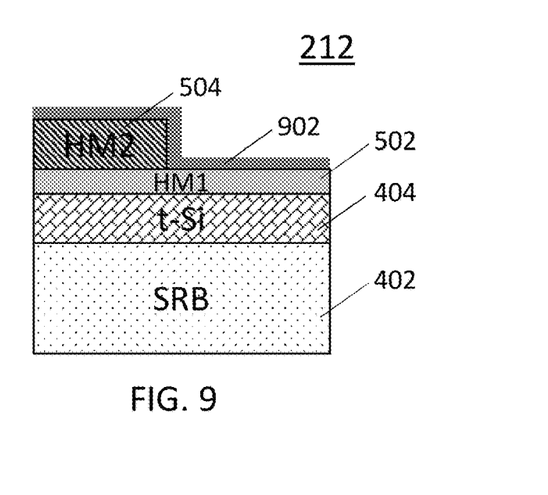
FIG. 9 is a cross-sectional illustration showing a fin-FET at step 212 of the operational flow diagram of FIG. 2.
Figure 10:
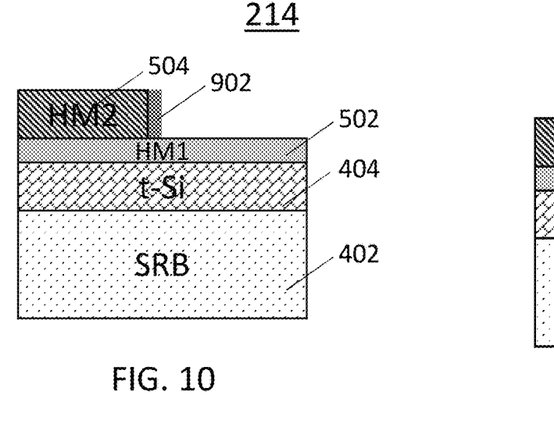
FIG. 10 is a cross-sectional illustration showing a fin-FET at step 214 of the operational flow diagram of FIG. 2.

At step 212, a thin spacer layer 902 is deposited over the wafer, as shown in FIG. 9. The spacer layer 902 may be formed using Si or a nitride material (such as titanium nitride (TiN)) depending upon the process and determined by the selectivity differences between the different hard mask layers HM1 502 and HM2 504. The spacer layer 902 may be deposited using reactive gases. At step 214, the spacer layer 902 is etched away using RIE, as shown in FIG. 10. RIE is performed so that the etching removes layers from the top down (i.e. in the vertical direction), so the portions of the spacer material that lay horizontally are removed while the vertical portions remain.

Figure 11:
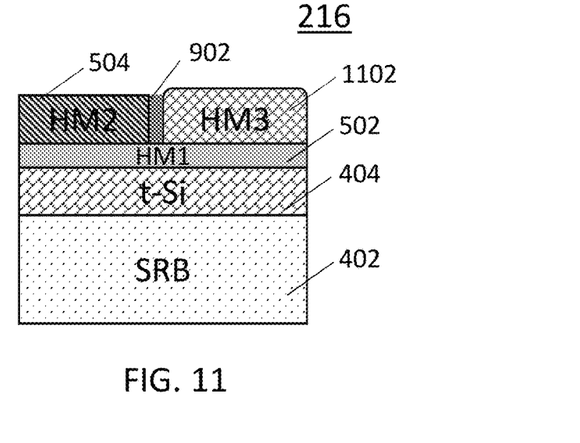
FIG. 11 is a cross-sectional illustration showing a fin-FET at step 216 of the operational flow diagram of FIG. 2.
Figure 12:
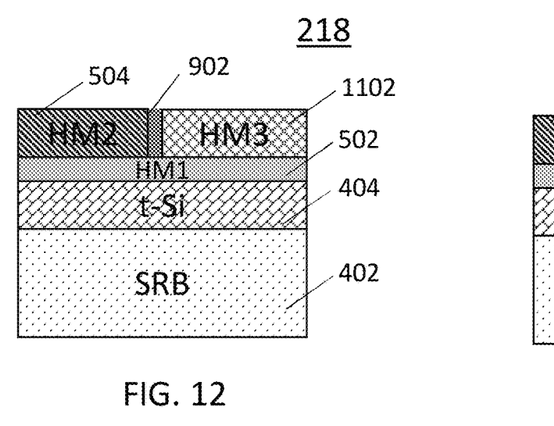
FIG. 12 is a cross-sectional illustration showing a fin-FET at step 218 of the operational flow diagram of FIG. 2.

At step 216, a third hard mask layer HM3 1102 is deposited on the wafer to fill the gaps formed in the HM2 504 layer. HM3 may be, for example, a-Si. Chemical mechanical polishing (CMP) is performed, at step 218, to level the HM3 layer 1102 to the height of the HM2 504 layer, as shown in FIG. 12.

Figure 13:
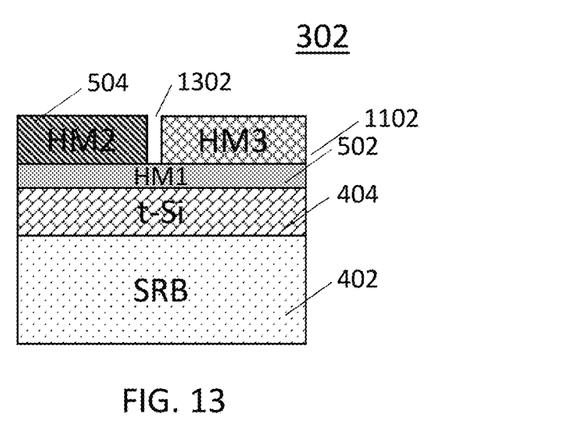
FIG. 13 is a cross-sectional illustration showing a fin-FET at step 302 of the operational flow diagram of FIG. 3.

The process 200 of FIG. 2 is continued at step 302 of FIG. 3, where the spacer material 902 is removed from the mask cavity, selective to HM2 504 and HM3 1102, forming a thin opening 1302 between HM2 504 and HM3 1102, as shown in FIG. 13. It should be noted that selectivity between the HM2, HM3 and spacer materials is important in removing the spacer. Generally, a 2× to 3× or greater difference in selectivity is considered optimal. In addition, the width of the opening 1302 should provide a minimum pre-defined isolation spacing for a N to P channel boundary. It should be noted that the specific boundary thickness will vary depending upon the specific technology and application.

Figure 14:
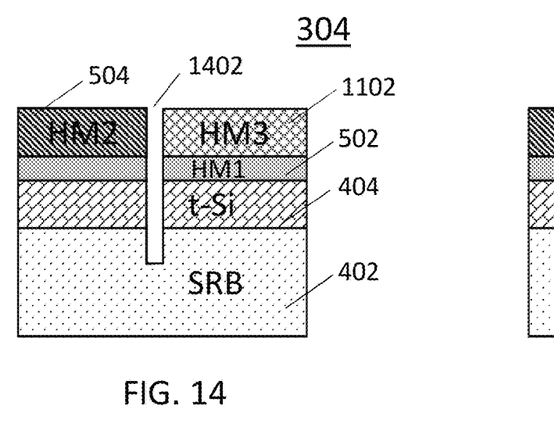
FIG. 14 is a cross-sectional illustration showing a fin-FET at step 304 of the operational flow diagram of FIG. 3.
Figure 15:
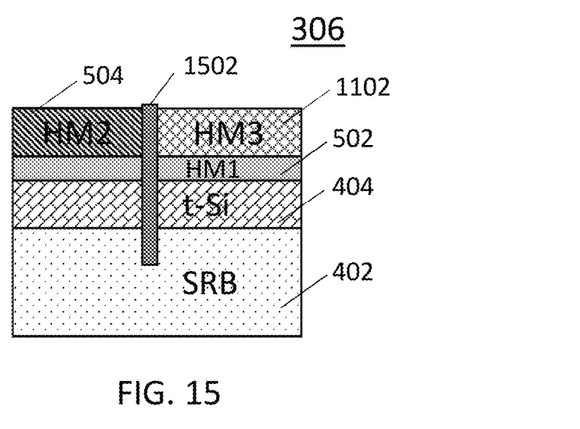
FIG. 15 is a cross-sectional illustration showing a fin-FET at step 306 of the operational flow diagram of FIG. 3.
Figure 16:
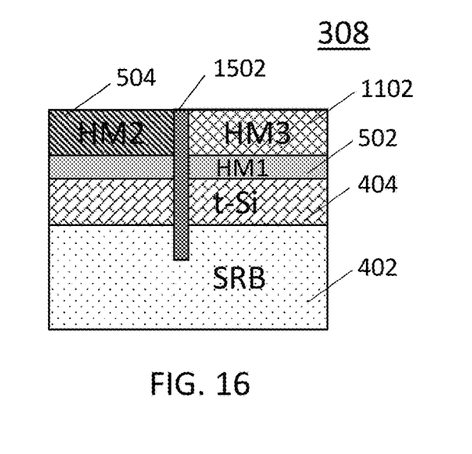
FIG. 16 is a cross-sectional illustration showing a fin-FET at step 308 of the operational flow diagram of FIG. 3.

At step 304, the wafer is etched deeper at the location where the spacer materials were previously removed to form a cavity 1402 that extends into the SRB 402 layer, as shown in FIG. 14. The etching may be performed using chemical etching and/or RIE. Depth of the cavity 1402 may be determined dependent upon the time duration of the etching. At step 306, the cavity 1402 is filled with an isolation material, such as a simple oxide, to form a filled cavity 1502, as shown in FIG. 15. CMP is performed, at step 308, to level the filled cavity 1502, as shown in FIG. 16.

Figure 17:
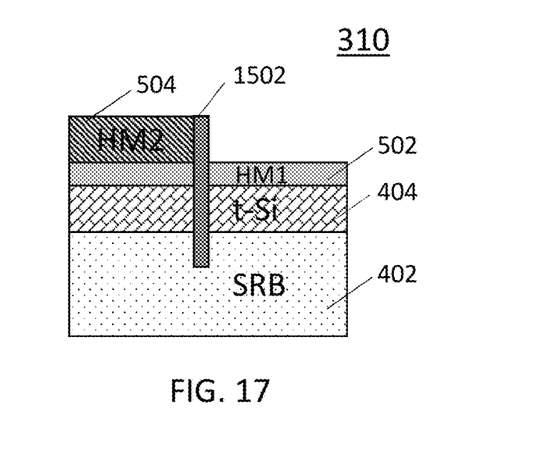
FIG. 17 is a cross-sectional illustration showing a fin-FET at step 310 of the operational flow diagram of FIG. 3.
Figure 18:
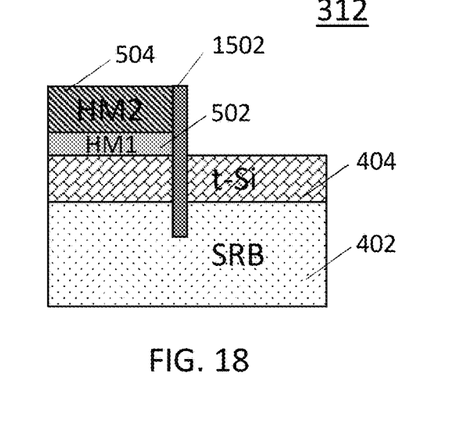
FIG. 18 is a cross-sectional illustration showing a fin-FET at step 312 of the operational flow diagram of FIG. 3.
Figure 19:
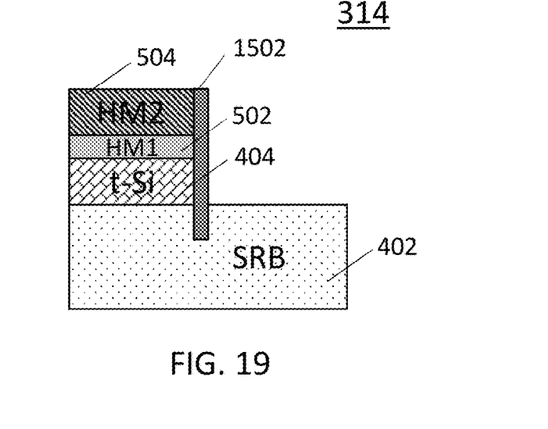
FIG. 19 is a cross-sectional illustration showing a fin-FET at step 314 of the operational flow diagram of FIG. 3.

At step 310, the HM3 material 1102 is removed in the P-type region selective to HM1 502, HM2 504, and the isolation material in the filled cavity 1502, as shown in FIG. 17. At step 312, the HM1 layer 502 is removed in the P-type region selective to HM2 504, t-Si 404 and the filled cavity 1502, as shown in FIG. 18. At step 314, the t-Si 404 in the P-type region is removed selective to the SRB layer 402 by a wet etch process, as shown in FIG. 19. The selective removal of the t-Si 404 in the P-type regions of the wafer creates a pattern of self-aligned small cavities for growth of P channel material.

Figure 20:
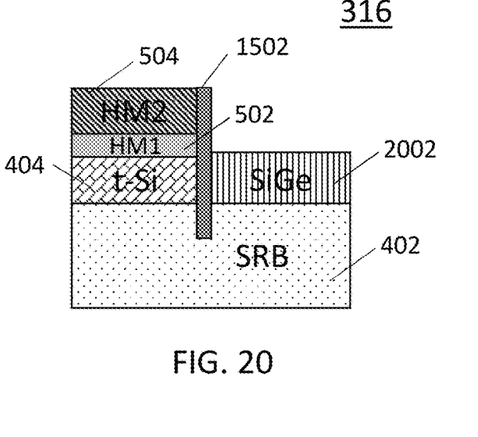
FIG. 20 is a cross-sectional illustration showing a fin-FET at step 316 of the operational flow diagram of FIG. 3.
Figure 21:
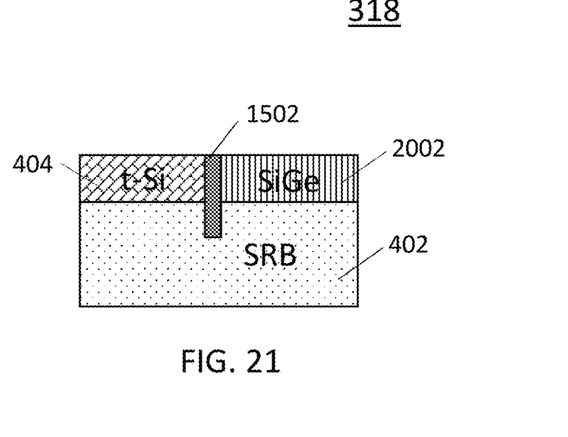
FIG. 21 is a cross-sectional illustration showing a finished fin-FET at step 318 of the operational flow diagram of FIG. 3.

At step 316, the wafer is pre-epi cleaned and P channel material 2002 (such as SiGe) is grown in the P channel area, as shown in FIG. 20. At step 318, the HM2 504 and HM1 502 layers are removed from the wafer, as shown in FIG. 21. It should be noted that the N-channel (i.e. side having the t-Si portion 404) and the P-channel (i.e. side having the SiGe portion 2002) are flush with the SRB layer 402 and have equal heights. Additionally, the edges of the P-channel and the N-channel form a perfectly straight right angle (i.e. having no rounded corners), and the isolation material in the cavity 1502 is a minimum thickness for a boundary between P and N type channels. These characteristics provide for more uniform and predictable performance for each device on the wafer and maximize usable area of the wafer.

Non-Limiting Embodiments

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating fin field effect transistors in a wafer, the method comprising:
   creating a pattern of self-aligned small cavities for P-type material growth using at least two hard mask layers by:
      depositing a first hard mask material and a second hard mask material over a starting substrate wafer, the starting substrate wafer comprising an N-type material covering a strain relief buffer layer, the first hard mask material forming a first hard mask layer of the at least two hard mask layers, the first hard mask layer covering the N-type material, the second hard mask material forming a second hard mask layer of the at least two hard mask layers, the second hard mask layer covering the first hard mask layer;
      selectively depositing photo resist over a plurality of areas designated as N-type areas;
      reactive ion etching to remove the second hard mask layer material over areas not covered by photo resist to create gaps in second hard mask layer, the gaps designating a plurality of P-type areas; and
      removing the photo resist to expose the second hard mask material in the N-type areas;
   generating a pre-defined isolation area around each self-aligned small cavity using a vertical spacer;
   selectively removing N-type material from the self-aligned small cavities; and
   growing P-type material in the self-aligned small cavities.

2. The method of claim 1, wherein the P-type material is silicon germanium (SiGe).

3. The method of claim 1, wherein the N-type material is tensile Silicon (t-Si).

4. The method of claim 1, wherein first hard mask material is silicon nitride (SiN).

5. The method of claim 1, wherein second hard mask material is oxide.

6. The method of claim 1, wherein generating a pre-defined isolation area around each self-aligned small cavity using a vertical spacer comprises:
   forming a vertical spacer between the second hard mask material and the gaps;
   depositing a third hard mask material in the gaps;
   deep etching to remove the vertical spacer and form a channel that extends into the strain relief buffer layer; and
   filling the channel.

7. The method of claim 1, wherein the first hard mask material has a different chemical composition than the second hard mask material.

8. The method of claim 6, wherein the third hard mask material is Amorphise Silicon (a-Si).

9. The method of claim 6, wherein the vertical spacer is formed by:
   depositing a spacer material over the wafer; and
   etching away the spacer material over the second hard mask material and the first hard mask material vertically to remove spacer material laying horizontally over the second hard mask material and the first hard mask material while leaving a small vertical boundary of spacer material between the second hard mask material and the gaps.

10. The method of claim 9, wherein the vertical spacer has a minimum boundary thickness.

11. The method of claim 9, wherein the vertical spacer comprises titanium nitride (TiN).

12. The method of claim 6, further comprising:
   subsequent to depositing the third hard mask material in the gaps, chemical mechanical polishing the wafer to level the third hard mask material.

13. The method of claim 12, wherein the channel is filled with a simple oxide.

14. The method of claim 6, wherein selectively removing N-type material from the self-aligned small cavities comprises sequentially removing the third hard mask material, the first hard mask material and the N-type material.

15. The method of claim 1, further comprising removing the second hard mask material and the first hard mask material from the N-type areas.

16. The method of claim 1, wherein the N-type material and the P-type material have a same channel height throughout the wafer.

17. The method of claim 1, wherein some of the self-aligned small cavities have different surface areas.

18. The method of claim 1, wherein prior to growing P-type material in the self-aligned small cavities, an intersection formed between the N-type material and each self-aligned small cavity is a right angle having no corner rounding.

19. The method of claim 1, further comprising:
   chemical mechanical polishing the wafer to level the N-type material and the P-type material.

\* \* \* \* \*